US009360905B2

(12) United States Patent
Zhamu et al.

(10) Patent No.: US 9,360,905 B2
(45) Date of Patent: *Jun. 7, 2016

(54) THERMAL MANAGEMENT SYSTEM CONTAINING AN INTEGRATED GRAPHENE FILM FOR ELECTRONIC DEVICES

(75) Inventors: Aruna Zhamu, Centerville, OH (US); Mingchao Wang, Fairbone, OH (US); Wei Xiong, Dayton, OH (US); Bor Z. Jang, Centerville, OH (US)

(73) Assignee: Nanotek Instruments, Inc., Dayton, OH (US)

( * ) Notice: Subject to any disclaimer, the term of this patent is extended or adjusted under 35 U.S.C. 154(b) by 836 days.

This patent is subject to a terminal disclaimer.

(21) Appl. No.: 13/506,265

(22) Filed: Apr. 9, 2012

(65) Prior Publication Data
US 2013/0264041 A1 Oct. 10, 2013

(51) Int. Cl.
*C01B 31/04* (2006.01)
*G06F 1/20* (2006.01)
*H01L 23/373* (2006.01)
*C04B 35/52* (2006.01)
*C04B 35/532* (2006.01)
*C04B 35/622* (2006.01)
*B82Y 30/00* (2011.01)
*B82Y 40/00* (2011.01)

(52) U.S. Cl.
CPC ............... *G06F 1/203* (2013.01); *B82Y 30/00* (2013.01); *B82Y 40/00* (2013.01); *C01B 31/0438* (2013.01); *C01B 31/0469* (2013.01); *C01B 31/0476* (2013.01); *C04B 35/522* (2013.01); *C04B 35/532* (2013.01); *C04B 35/62218* (2013.01); *H01L 23/373* (2013.01); *C04B 2235/6025* (2013.01); *C04B 2235/9607* (2013.01); *H01L 2924/0002* (2013.01)

(58) Field of Classification Search
CPC . C01B 31/0438; C01B 31/0476; G06F 1/203; H01L 23/373
USPC .................................................. 428/688, 448
See application file for complete search history.

(56) References Cited

U.S. PATENT DOCUMENTS

| | | | |
|---|---|---|---|
| 3,404,061 A | 10/1968 | Shane et al. | |
| 6,482,520 B1 | 11/2002 | Tzeng | |
| 7,071,258 B1 | 7/2006 | Jang et al. | |
| 7,166,237 B2 * | 1/2007 | Klett et al. | 252/67 |
| 7,292,441 B2 | 11/2007 | Smalc et al. | |
| 7,566,410 B2 * | 7/2009 | Song et al. | 252/511 |
| 7,662,321 B2 * | 2/2010 | Guo et al. | 264/108 |
| 8,173,095 B2 * | 5/2012 | de Heer et al. | 423/448 |
| 8,778,538 B2 * | 7/2014 | Kung et al. | 429/231.8 |
| 2005/0271574 A1 * | 12/2005 | Jang et al. | 423/448 |
| 2006/0056157 A1 * | 3/2006 | Ford et al. | 361/704 |
| 2006/0086493 A1 * | 4/2006 | Fujiwara et al. | 165/185 |
| 2006/0126304 A1 * | 6/2006 | Smalc et al. | 361/704 |
| 2006/0216222 A1 * | 9/2006 | Jang | 423/448 |
| 2007/0053168 A1 * | 3/2007 | Sayir et al. | 361/718 |
| 2008/0048152 A1 * | 2/2008 | Jang et al. | 252/378 R |
| 2008/0202386 A1 * | 8/2008 | Hougham et al. | 106/472 |
| 2008/0206124 A1 * | 8/2008 | Jang et al. | 423/415.1 |
| 2008/0248275 A1 * | 10/2008 | Jang et al. | 428/220 |
| 2009/0022649 A1 * | 1/2009 | Zhamu et al. | 423/415.1 |
| 2009/0028777 A1 * | 1/2009 | Zhamu et al. | 423/448 |
| 2009/0028778 A1 * | 1/2009 | Zhamu et al. | 423/448 |
| 2010/0055025 A1 * | 3/2010 | Jang et al. | 423/448 |
| 2010/0055458 A1 * | 3/2010 | Jang et al. | 428/402 |
| 2010/0085713 A1 | 4/2010 | Balandin et al. | |
| 2010/0128439 A1 * | 5/2010 | Tilak et al. | 361/709 |
| 2010/0140792 A1 | 6/2010 | Haddon et al. | |
| 2010/0143798 A1 * | 6/2010 | Zhamu et al. | 429/212 |
| 2010/0144904 A1 * | 6/2010 | Wang et al. | 516/98 |
| 2010/0176337 A1 * | 7/2010 | Zhamu et al. | 252/182.1 |
| 2010/0301279 A1 * | 12/2010 | Nesper et al. | 252/502 |
| 2011/0059599 A1 * | 3/2011 | Ward et al. | 438/507 |
| 2011/0108978 A1 | 5/2011 | Kim et al. | |
| 2011/0159372 A1 * | 6/2011 | Zhamu et al. | 429/232 |
| 2011/0186789 A1 * | 8/2011 | Samulski et al. | 252/514 |
| 2011/0189452 A1 * | 8/2011 | Lettow et al. | 428/220 |
| 2011/0227000 A1 * | 9/2011 | Ruoff et al. | 252/502 |
| 2011/0247795 A1 * | 10/2011 | Horng | 165/185 |
| 2011/0268647 A1 * | 11/2011 | Ivanovici et al. | 423/448 |
| 2011/0274610 A1 * | 11/2011 | Paquette et al. | 423/415.1 |
| 2011/0280787 A1 * | 11/2011 | Chen et al. | 423/415.1 |
| 2011/0318257 A1 * | 12/2011 | Sokolov et al. | 423/448 |
| 2012/0021224 A1 * | 1/2012 | Everett et al. | 428/408 |
| 2012/0034442 A1 * | 2/2012 | Pauzauskie et al. | 428/219 |
| 2012/0128570 A1 * | 5/2012 | Krishnaiah et al. | 423/415.1 |
| 2012/0164433 A1 * | 6/2012 | Advincula | 428/327 |

(Continued)

OTHER PUBLICATIONS

Xu et al. ACS Nano, vol. 4(7), 4324-4330, 2010.*
U.S. Appl. No. 10/858,814, filed Jun. 3, 2004, B. Jang, et al.
U.S. Appl. No. 11/509,424, filed Aug. 25, 2006, B. Jang, et al.
Wei Yu, et al., "Significant thermal conductivity enhancement in graphene oxide papers modified with alkaline earth," Appl. Phys. Lett. 103, 141913 (2013).
Zhi-Ling Hou, et al, "Flexible Graphene-Graphene Composites of Superior Thermal and Electrical Transport Properties," ACS Appl. Mater. Interfaces 2014, 6, 15026-15032.

(Continued)

Primary Examiner — Liam J Heincer

(57) ABSTRACT

Disclosed is a graphene-based heat dissipation system for an electronic device, comprising: (a) an electronic device comprising a heat source, wherein the heat source transmits heat to a second component or an external surface of the electronic device; (b) a heat-conducting layer comprising two major surfaces, the heat-conducting layer being positioned such that one of its major surfaces is in operative contact with the heat source such that it is interposed between the heat source and the second component or the external surface of the electronic device; wherein the heat-conducting layer comprises at least one sheet of integrated graphene film which thermally shields the second component or the external surface of the electronic device from heat generated by the heat source.

37 Claims, 5 Drawing Sheets

(56) References Cited

U.S. PATENT DOCUMENTS

| | | | |
|---|---|---|---|
| 2012/0190139 A1* | 7/2012 | Na et al. | 438/22 |
| 2012/0202056 A1* | 8/2012 | Wolf et al. | 428/336 |
| 2012/0205606 A1* | 8/2012 | Lee et al. | 257/2 |
| 2012/0211159 A1* | 8/2012 | Hougham et al. | 156/324 |
| 2012/0234524 A1* | 9/2012 | Fan et al. | 165/185 |
| 2012/0270960 A1* | 10/2012 | Felisari et al. | 521/90 |
| 2012/0272868 A1* | 11/2012 | Berry et al. | 106/286.8 |
| 2013/0001068 A1* | 1/2013 | Zhamu et al. | 204/157.42 |
| 2013/0005917 A1* | 1/2013 | Zhamu et al. | 525/376 |
| 2013/0015409 A1* | 1/2013 | Fugetsu | 252/500 |
| 2013/0059143 A1* | 3/2013 | Liang et al. | 428/220 |
| 2013/0087446 A1* | 4/2013 | Zhamu et al. | 204/157.43 |
| 2013/0130037 A1* | 5/2013 | Bol et al. | 428/408 |
| 2013/0136684 A1* | 5/2013 | Wu et al. | 423/448 |
| 2013/0180912 A1* | 7/2013 | Li | 210/500.21 |
| 2013/0181166 A1* | 7/2013 | Tetsuka | 252/301.34 |
| 2013/0190449 A1* | 7/2013 | Kinloch et al. | 525/50 |
| 2013/0200300 A1* | 8/2013 | Do et al. | 252/75 |
| 2013/0213630 A1* | 8/2013 | Southard, II | 165/185 |
| 2013/0230722 A1* | 9/2013 | Fujii et al. | 428/408 |
| 2013/0236715 A1* | 9/2013 | Zhamu et al. | 428/220 |
| 2013/0272951 A1* | 10/2013 | Hiura et al. | 423/448 |
| 2013/0329366 A1* | 12/2013 | Wang et al. | 361/704 |
| 2014/0037531 A1* | 2/2014 | Liu et al. | 423/415.1 |
| 2014/0050910 A1* | 2/2014 | Mukherjee et al. | 428/219 |
| 2014/0079932 A1* | 3/2014 | Aksay et al. | 428/219 |
| 2014/0120024 A1* | 5/2014 | Tour et al. | 423/415.1 |
| 2014/0124176 A1* | 5/2014 | Zhamu et al. | 165/133 |
| 2014/0127488 A1* | 5/2014 | Zhamu et al. | 428/216 |
| 2014/0154941 A1* | 6/2014 | Zhamu et al. | 442/136 |
| 2014/0170057 A1* | 6/2014 | Huang et al. | 423/448 |
| 2014/0190676 A1* | 7/2014 | Zhamu et al. | 165/185 |

OTHER PUBLICATIONS

Balandin, A. A. et al. Superior thermal conductivity of single-layer graphene. Nano Lett. 8, 902-907 (2008).

S. Ghosh, et. al "Dimensional crossover of thermal transport in few-layer graphene," Nature Materials, 9, 555-558 (2010).

Eric Pop, et al. "Thermal properties of graphene: Fundamentals and applications," MRS Bulletin, vol. 37 (Dec. 2012) 1273-1281.

Jae Hun Seol, et al. "Two-Dimensional Phonon Transport in Supported Graphene," Science, vol. 328 No. 5975 (Apr. 2010) pp. 213-216.

* cited by examiner

THERMAL MANAGEMENT SYSTEM CONTAINING AN INTEGRATED GRAPHENE FILM FOR ELECTRONIC DEVICES

The present invention claims the benefits of a co-pending patent application: A. Zhamu, et al., "Graphene Oxide Gel Bonded Graphene Composite Films and Processes for Producing Same," U.S. patent application Ser. No. 13/385,813 (Mar. 8, 2012).

This invention is based on the results of a research project sponsored by the US National Science Foundation SBIR-STTR Program.

FIELD OF THE INVENTION

The present invention relates generally to the field of graphitic materials for heat dissipation applications, and more particularly to integrated graphene films and graphene-graphene oxide composite films with an exceptionally high thermal conductivity, high electrical conductivity, and high mechanical strength for electronic device applications.

BACKGROUND OF THE INVENTION

Carbon is known to have five unique crystalline structures, including diamond, fullerene (O-D nano graphitic material), carbon nano-tube (1-D nano graphitic material), graphene (2-D nano graphitic material), and graphite (3-D graphitic material).

The carbon nano-tube (CNT) refers to a tubular structure grown with a single wall or multi-wall, which can be conceptually obtained by rolling up a graphene sheet or several graphene sheets to form a concentric hollow structure. Carbon nano-tubes have a diameter on the order of a few nanometers to a few hundred nanometers. Its longitudinal, hollow structure imparts unique mechanical, electrical and chemical properties to the material.

A graphene plane in a graphite crystal is composed of carbon atoms occupying a two-dimensional hexagonal lattice. The constituent graphene planes can be extracted or isolated from a graphite crystal to form individual graphene sheets. An isolated, individual graphene sheet is commonly referred to as single-layer graphene. A stack of multiple graphene planes bonded through van der Waals forces in the thickness direction is commonly referred to as a multi-layer graphene, typically having 2-300 layers or graphene planes, but more typically 2-100 graphene planes. Single-layer graphene and multi-layer graphene sheets are collectively called "nano-scaled graphene platelets" (NGPs). Our research group pioneered the development of graphene materials and related production processes as early as 2002: (1) B. Z. Jang and W. C. Huang, "Nano-scaled Graphene Plates," U.S. Pat. No. 7,071,258 (Jul. 4, 2006), application submitted in October 2012; (2) B. Z. Jang, et al. "Process for Producing Nano-scaled Graphene Plates," U.S. patent application Ser. No. 10/858,814 (Jun. 3, 2004); and (3) B. Z. Jang, A. Zhamu, and J. Guo, "Process for Producing Nano-scaled Platelets and Nanocomposites," U.S. patent application Ser. No. 11/509,424 (Aug. 25, 2006).

NGPs are typically obtained by intercalating natural graphite flakes with a strong acid and/or oxidizing agent to obtain a graphite intercalation compound (GIC) or graphite oxide, as illustrated in FIG. 1. This is most often accomplished by immersing natural graphite flakes in a mixture of sulfuric acid, nitric acid (an oxidizing agent), and another oxidizing agent (e.g. potassium permanganate or sodium chlorate). The resulting GIC is actually some type of graphite oxide particles. This GIC is then repeatedly washed and rinsed in water to remove excess acids, resulting in a graphite oxide suspension or dispersion which contains discrete and visually discernible graphite oxide particles dispersed in water. There are two processing routes to follow after this rinsing step:

Route 1 involves removing water from the suspension to obtain "expandable graphite," which is essentially dried GIC or dried graphite oxide particles. Upon exposure of expandable graphite to a temperature in the range of 800-1050° C. for approximately 30 seconds to 2 minutes, the GIC expands by a factor of 30-300 to form a "graphite worm," which is a collection of exfoliated, but largely un-separated or interconnected graphite flakes. In Route 1A, these graphite worms (exfoliated graphite or "networks of interconnected/non-separated graphite flakes") can be re-compressed to obtain flexible graphite sheets that typically have a thickness in the range of 0.125 mm (125 µm)-0.5 mm (500 µm). Both exfoliated graphite and the recompressed version (flexible graphite) remain as a 3-D graphitic material that is fundamentally different and patently distinct from either 1-D CNT or 2-D graphene.

As disclosed by M. Smalc, et al, U.S. Pat. No. 7,292,441 (Nov. 6, 2007) and U.S. Pat. No. 6,982,874 (Jun. 3, 2006), and J. W. Tzeng, U.S. Pat. No. 6,482,520 (Nov. 19, 2002), these flexible graphite (FG) sheets can be used as a heat spreader material, but exhibiting a maximum in-plane thermal conductivity of less than 500 W/mK (typically <300 W/mK) and in-plane electrical conductivity no greater than 1,500 S/cm.

In Route 1B, the exfoliated graphite is subjected to mechanical shearing (e.g. using an ultrasonicator, high-shear mixer, air jet mill, or ball mill) to form separated single-layer and multi-layer graphene sheets (collectively, NGPs), as disclosed in our U.S. application Ser. No. 10/858,814. Single-layer graphene can be as thin as 0.34 nm, while multi-layer graphene can have a thickness up to 100 nm. In the present application, the thickness of multi-layer NGPs is preferably less than 20 nm.

Route 2 entails ultrasonicating the graphite oxide suspension for the purpose of separating individual graphene oxide sheets from graphite oxide particles. This is based on the notion that the inter-graphene plane separation has been increased from 0.335 nm in natural graphite to 0.6-1.1 nm in highly oxidized graphite oxide, significantly weakening the van der Waals forces that hold neighboring planes together. Ultrasonic power can be sufficient to further separate graphene plane sheets to form separate, isolated, or discrete graphene oxide (GO) sheets. These graphene oxide sheets can then be chemically or thermally reduced to obtain "reduced graphene oxides" (RGO) typically having an oxygen content of 2-10% by weight, more typically 2-5% by weight.

For the purpose of defining the claims of the instant application, NGPs include single-layer and multi-layer graphene or reduced graphene oxide with an oxygen content of 0-10% by weight, more typically 0-5% by weight, and preferably 0-2% weight. Pristine graphene has essentially 0% oxygen.

It may be noted that flexible graphite sheets (obtained by re-compression of exfoliated graphite or graphite worms) for electronic device thermal management applications have the following major deficiencies:

(1) As indicated earlier, flexible graphite (FG) sheets exhibit a relatively low thermal conductivity, typically <500 W/mK and more typically <300 W/mK.
(2) Flexible graphite sheets are also of low strength and poor structural integrity. The high tendency for flexible graphite sheets to get torn apart makes them difficult to handle in the process of integrating them in a microelectronic device.

(3) Another very subtle, largely ignored or overlooked, but critically important feature of FG sheets is their high tendency to get flaky with graphite flakes easily coming off from FG sheet surfaces and emitting out to other parts of a microelectronic device. These highly electrically conducting flakes (typically 1-500 μm in lateral dimensions and >100 nm in thickness) can cause internal shorting and failure of electronic devices.

(4) For this reason, it is necessary to apply a protective coating onto a surface or both surfaces of a flexible graphite sheet in order to prevent graphite flakes from being released.

Similarly, the NGPs, when packed into a film or paper sheet of non-woven aggregates, exhibit a thermal conductivity higher than 1,000 W/mK only when the film or paper is cast and pressed into a sheet having a thickness lower than 10 μm, and higher than 1,500 W/mK only when the film or paper is cast and pressed into a sheet having a thickness lower than 1 μm. This is reported in our earlier U.S. patent application Ser. No. 11/784,606 (Apr. 9, 2007). However, ultra-thin film or paper sheets (<10 μm) are difficult to produce in mass quantities, and difficult to handle when one tries to incorporate these thin films as a heat spreader material during the manufacturing of microelectronic devices. Further, thickness dependence of thermal conductivity (not being able to achieve a high thermal conductivity at a wide range of film thicknesses) is not a desirable feature. Non-woven aggregates of NGPs (graphene sheets or platelets) also have a tendency to get flaky.

Our earlier application (U.S. application Ser. No. 11/784,606) further disclosed a mat, film, or paper of NGPs infiltrated with a metal, glass, ceramic, resin, and CVD graphite matrix material. Later on, Haddon, et al (US Pub. No. 2010/0140792, Jun. 10, 2010) also reported NGP thin film and NGP-polymer composites for thermal management applications. The processes used by Haddon et al to produce NGPs are identical to those disclosed much earlier by us (Jang, et al. U.S. patent application Ser. No. 10/858,814 (Jun. 3, 2004)). The NGP-polymer composites, as an intended thermal interface material, have very low thermal conductivity, typically <<2 W/mK. The NGP films of Haddon, et al are essentially non-woven aggregates of graphene platelets, identical to those of our earlier invention (U.S. application Ser. No. 11/784,606). Again, these aggregates have a great tendency to have graphite particles flaking and separated from the film surface, creating internal shorting problem for the electronic device containing these aggregates. They also exhibit low thermal conductivity unless made into thin films (10 nm-300 nm, as reported by Haddon, et al) which are very difficult to handle in a real device manufacturing environment. Balandin, et al (US Pub. No. 2010/0085713, Apr. 8, 2010) also disclosed a graphene layer produced by CVD deposition or diamond conversion for heat spreader application. More recently, Kim, et al (N. P. Kim and J. P. Huang, "Graphene Nanoplatelet Metal Matrix," US Pub. No. 2011/0108978, May 10, 2011) reported metal matrix infiltrated NGPs. However, metal matrix material is too heavy and the resulting metal matrix composite does not exhibit a high thermal conductivity.

Another prior art material for thermal management application is the pyrolitic graphite film. The lower portion of FIG. 1 illustrates a process for producing prior art pyrolitic graphitic films or sheets. The process begins with carbonizing a polymer 46 at a carbonization temperature of 500-1,000° C. for 2-10 hours to obtain a carbonized material 48, which is followed by a graphitization treatment at 2,500-3,200° C. for 5-24 hours to form a graphitic film 50. This is a slow, tedious, and energy-intensive process. Carbonization of certain polymers (e.g. polyacrylonitrile) involves the emission of toxic species.

Thus, it is an object of the present invention to provide a highly thermally conductive composite thin film (composed of graphene oxide-bonded graphene sheets, also herein referred to as "GO gel-bonded NGPs" or "GO-bonded NGPs") and an integrated graphene film (obtained by heat-treating graphene oxide gel to merge graphene oxide sheets in an edge-to-edge manner) that can be used for thermal management applications (e.g. for use as a heat spreader) in a microelectronic device, such as a mobile phone (including a smart phone), a notebook computer, a tablet, an e-book, a telecommunication device, and any hand-held computing device or portable microelectronic device.

It is a particular object of the present invention to provide a highly conductive integrated graphene film and GO gel-bonded NGP composite thin-film structure that exhibits a thermal conductivity greater than 600 W/mK, typically greater than 800 W/mK, more typically greater than 1,500 W/mK (even when the film thickness is greater than 10 μm), and most preferably and often greater than 1,700 W/mK.

It is another object of the present invention to provide an NGP-GO composite thin-film or integrated graphene film that exhibits a relatively thickness-independent thermal conductivity.

Still another object of the present invention is to provide a GO-bonded pristine graphene composite thin film or an integrated graphene film that exhibits exceptional thermal and electrical conductivity properties.

It is a further object of the present invention to provide an NGP-GO composite thin-film sheet or an integrated graphene film that is lightweight and exhibits a relatively high strength or structural integrity.

It is yet another object of the present invention to provide a highly conductive NGP-GO composite thin-film sheet or an integrated graphene film wherein the in-plane thermal conductivity is greater than 600 W/mK (preferably and typically greater than 1,000 W/mK) and in plane electrical conductivity is greater than 2,000 S/cm (preferably and typically >3,000 S/cm), and/or a tensile strength greater than 10 MPa (preferably and typically >40 MPa).

SUMMARY OF THE INVENTION

The present invention provides a graphene-based heat dissipation system for an electronic device, comprising: (a) an electronic device comprising a heat-generating source (or heat source), wherein the heat source transmits heat to a second component or an external surface of the electronic device; (b) a heat-conducting layer comprising two major surfaces, the heat-conducting layer being positioned in such a manner that one of its major surfaces is in operative contact with the heat source such that it is interposed between the heat source and the second component or the external surface of the electronic device; wherein the heat-conducting layer comprises at least one sheet of integrated graphene film which thermally shields the external surface or the second component of the electronic device from heat generated by the heat source.

The heat source of the electronic device may be a central processing unit (CPU) of a computing device, such as a mobile phone (including a smart phone), notebook computer, tablet, e-book, a telecommunication device, and any hand-held or portable electronic device. The heat source may be a battery housed inside a computing device. The electronic device may further comprise a heat dissipation device positioned in a location not directly adjacent to the heat source and further wherein one of the major surfaces of the heat-conducting layer is in operative contact with the heat dissipation device. The heat dissipation device can be a heat sink, a heat pipe, a heat plate, or a combination thereof.

The integrated graphene film may be a graphene film formed from a graphene oxide gel (further described in later paragraphs) or a graphene composite film formed of graphene oxide gel-bonded nano graphene platelets (NGPs).

The graphene composite thin film may be composed of nano graphene platelets (NGPs) bonded by a graphene oxide binder. There is no other resin binder or matrix material involved or included in this graphene composite. In other words, there is no polymer matrix, metal matrix, ceramic matrix, glass matrix, or carbon matrix used to hold NGPs together. The only binder or matrix material used is graphene oxide, which is chemically converted from the original form of a graphene oxide gel. The NGPs contain single-layer graphene or multi-layer graphene sheets having a thickness from 0.335 nm to 100 nm, and the NGPs occupy a weight fraction of 1% to 99.9% of the total composite weight. The graphene oxide binder, having an oxygen content of 1-40% by weight based on the total graphene oxide weight, occupies a weight fraction of 0.1% to 99% of the total composite weight. The composite forms a thin film with a thickness no greater than 1 mm, preferably thinner than 200 μm, and further preferably not greater than 100 μm. The film thickness is preferably thicker than 10 μm, but can be thinner. The multi-layer graphene sheets typically and preferably have a thickness of 3.35 nm to 33.5 nm and the film has a thickness preferably between 10 and 100 μm.

Preferably, the graphene oxide binder has an oxygen content of 1-10% by weight (preferably less than 2%) based on the total graphene oxide weight measured after the final heat treatment procedure is completed. The graphene oxide may be obtained from a graphene oxide gel. This gel is obtained by immersing a graphitic material in a powder or fibrous form in a strong oxidizing liquid in a reaction vessel at a reaction temperature for a length of time sufficient to obtain a graphene oxide gel. This graphene oxide gel has the characteristics that it is optically transparent or translucent and visually homogeneous with no discernible discrete graphene or graphene oxide sheets dispersed therein. In contrast, conventional suspension of discrete graphene or graphene oxide sheets, or graphite flakes in water, acid, or solvent looks opaque, dark, black or heavy brown in color with individual graphene, graphene oxide sheets, or graphite flakes being discernible or recognizable with naked eyes.

The graphene oxide molecules dissolved in a graphene oxide gel are aromatic chains that have an average number of benzene rings in the chain typically less than 1000, more typically less than 500, and most typically less than 100. Most of the molecules have more than 5 or 6 benzene rings (mostly >10 benzene rings) from combined atomic force microscopy, high-resolution TEM, and molecular weight measurements. These benzene-ring type of aromatic molecules have been heavily oxidized and contain functional groups, such as —COOH and —OH and, therefore, are "soluble" (not just dispersible) in polar solvents, such as water. When the graphene oxide gel is made, the oxygen content is typically in the range of 20-46% by weight and more typically 30-46% by weight.

These soluble molecules behave like polymers and are surprisingly capable of serving as a binder or adhesive that bonds NGPs together to form a composite thin film of good structural integrity and high thermal conductivity. Conventional discrete graphene or graphene oxide sheets do not have any binding or adhesion power.

A preferred embodiment of the present invention is a heat-dissipating system that contains an integrated graphene film that is produced by casting a graphene oxide gel into a thin film form and then removing the liquid component of the gel. The material is then subjected to a heat treatment at a temperature of 100-3,200° C. (more preferably 300-1,500° C.), allowing individual graphene oxide molecules to link up or merge with one another into an essentially unitary entity (as opposed just a simple aggregate of individual graphene sheets). The resulting integrated graphene film is a single-grain or few-grain graphene sheet that has no or few sheet-to-sheet grain boundaries. After such a heat treatment or re-graphitization treatment, the oxygen content is typically less than 10% and most typically less than 2%.

Another preferred embodiment of the present invention is a heat-dissipating system featuring a graphene composite thin film that is obtained by mixing NGPs in a graphene oxide gel to form a NGP-graphene oxide mixture suspension, making the suspension into a thin film form, and removing the residual liquid from the mixture suspension. The resulting composite is composed of NGPs that are bonded by a graphene oxide binder to form an essentially pore-free film or an integral film of low porosity level (having a physical density greater than 1.6 g/cm$^3$, more typically >1.8 g/cm$^3$, and often >2.0 g/cm$^3$, approaching the theoretical density (2.25 g/cm$^3$) of graphene sheets.

The graphene oxide binder is made from a graphene oxide gel obtained by dissolving a graphitic material in a fluid containing a strong oxidizing agent at a desired temperature for a length of time sufficient to form a gel. The starting graphitic material for making graphene oxide gel may be selected from natural graphite, artificial graphite, meso-phase carbon, meso-phase pitch, meso-carbon micro-bead, soft carbon, hard carbon, coke, carbon fiber, carbon nano-fiber, carbon nano-tube, or a combination thereof. The NGPs may also be produced from a graphitic material selected from natural graphite, artificial graphite, meso-phase carbon, meso-phase pitch, meso-carbon micro-beads, soft carbon, hard carbon, coke, carbon fiber, carbon nano-fiber, carbon nano-tube, or a combination thereof.

The present invention further provides a bulk graphene composite composition composed of nano graphene platelets (NGPs) bonded by a graphene oxide binder obtained from a graphene oxide gel, wherein the NGPs contain single-layer graphene or multi-layer graphene sheets having a thickness from 0.335 nm to 100 nm, and the NGPs occupy a weight fraction of 1% to 99.9% of the total composite weight; and the graphene oxide binder, having an oxygen content of 0.1%-40% by weight based on the total graphene oxide weight, occupies a weight fraction of 0.1% to 99% of the total composite weight. This composite composition is a particularly effective heat spreader component in an electronic device.

The light weight (lower density compared to metal and ceramic materials), exceptional thermal conductivity, relatively high structural integrity, and no tendency to flake or emit graphite or graphene particles into open air make the invented integrated graphene film and graphene oxide bonded NGP composite an ideal thermal management material for electronic devices. The integrated graphene film has an electrical conductivity typically greater than 3000 S/cm and a thermal conductivity greater than 1,000 W/mK. In some cases, the integrated graphene film has an electrical conductivity greater than 1,500 S/cm, a thermal conductivity greater than 600 Wm$^{-1}$K$^{-1}$, a physical density greater than 1.4 g/cm$^3$, and a tensile strength greater than 10 MPa. More typically, the integrated graphene film has an electrical conductivity greater than 2,000 S/cm, a thermal conductivity greater than 800 W/mK, a physical density greater than 1.8 g/cm$^3$, and a tensile strength greater than 40 MPa. Even more typically and desirably, the integrated graphene film has an electrical conductivity greater than 3,000 S/cm, a thermal conductivity greater than 1,500 W/mK, a physical density greater than 2.0 g/cm$^3$, and a tensile strength greater than 40 MPa.

The present invention also provides a heat-dissipating system that contains an integrated graphene film produced from a graphene oxide gel, which gel is prepared by immersing a graphitic material in a powder or fibrous form in an oxidizing liquid to form an optically opaque suspension in a reaction vessel at a reaction temperature for a length of time sufficient to obtain a graphene oxide gel that is optically transparent or translucent, wherein the graphene oxide gel is composed of graphene oxide molecules dispersed in an acidic medium having a pH value of no higher than 5 and said graphene oxide molecules have an oxygen content no less than 20% by weight.

The integrated graphene film can be a film produced from a graphene oxide gel, which is prepared by immersing a graphitic material in an oxidizing agent to form an optically opaque suspension and allowing an oxidizing reaction to proceed until an optically transparent or translucent solution is formed, and wherein the graphitic material is selected from natural graphite, artificial graphite, meso-phase carbon, meso-phase pitch, meso-carbon micro-bead, soft carbon, hard carbon, coke, carbon fiber, carbon nano-fiber, carbon nano-tube, or a combination thereof.

In a preferred embodiment of the present invention, a thermal transfer material is positioned between the heat-conducting layer and the heat source. The thermal transfer material comprises a metal or a thermal interface material, which can be selected from a thermal grease, thermally conductive rubber, thermally conductive resin, thermally conductive soft material, etc.

The electronic device may be a portable computing device containing a central processing unit (CPU) and/or a battery as a heat source. The implementation of an integrated graphene film-based heat-dissipating provision was found to significantly reduce or eliminate several heat-induced device malfunction or poor function issues. For instance, a mobile phone featuring an integrated graphene film as a heat spreader was found to reduce an outer surface temperature by as much as 12 degrees Celsius (near the back surface where the battery is located) after a continuous use of the mobile phone for an extended period of time. In contrast, the use of a commercially available flexible graphite sheet from Graftech (associated with Advanced Energy Technology, Inc.) helps to reduce the temperature by only 3 degrees.

DESCRIPTION OF THE PREFERRED EMBODIMENTS

Figure 1:
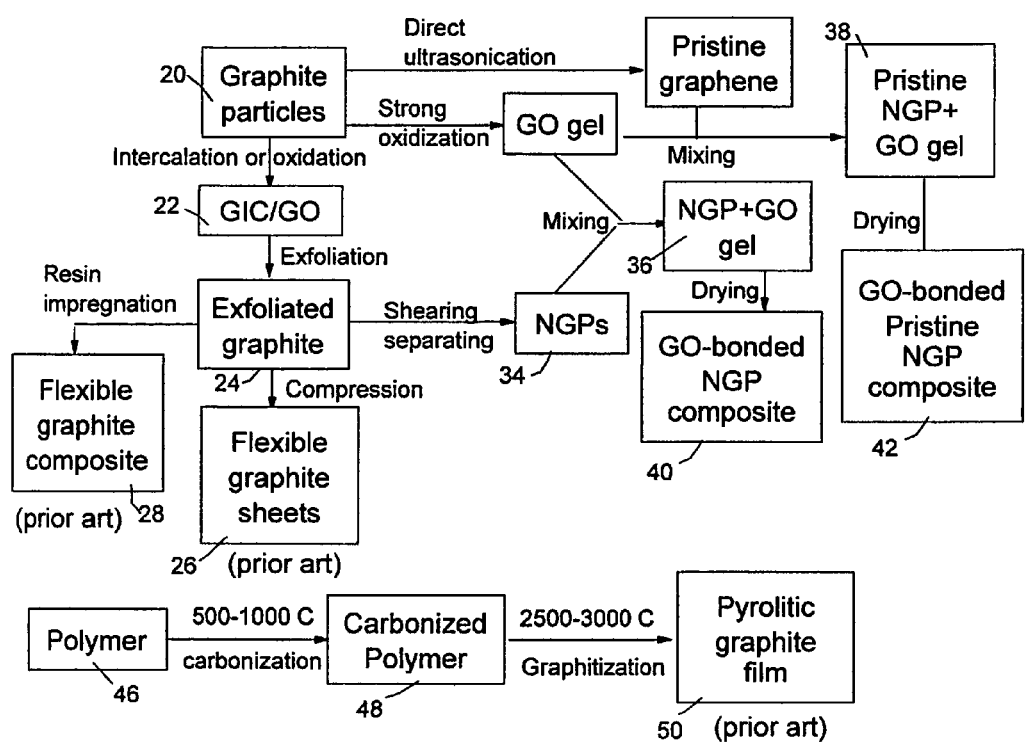
FIG. 1 A flow chart illustrating various prior art processes of producing exfoliated graphite products (flexible graphite sheets and flexible graphite composites) and pyrolytic graphite films, along with presently invented processes of producing a graphene oxide gel-bonded NGP composite.
Figure 2A:
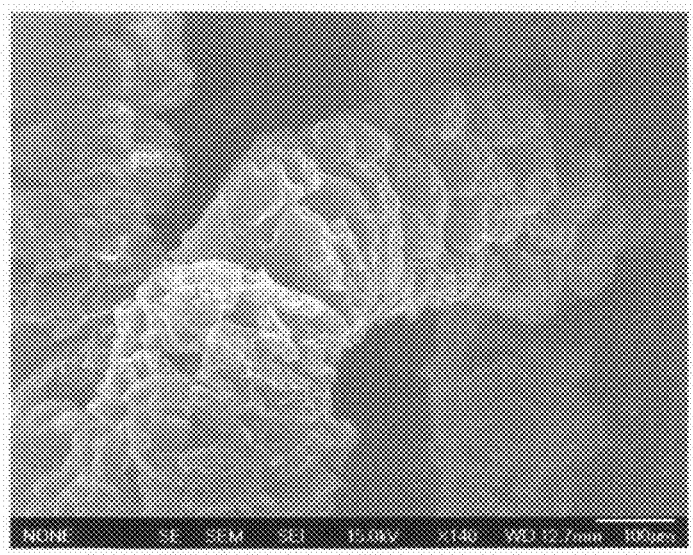
FIG. 2 (*a*) A SEM image of a graphite worm sample after exfoliation of graphite intercalation compounds (GICs); (*b*) An SEM image of a cross-section of a flexible graphite sheet, showing many graphite flakes with orientations not parallel to the flexible graphite sheet surface and many defect structures.
Figure 2B:
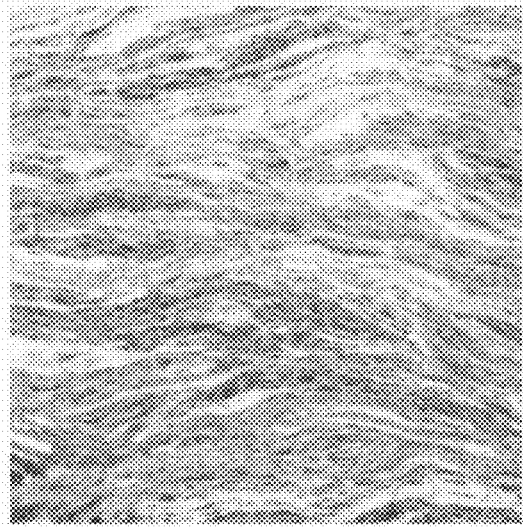

The present invention provides a graphene-based heat dissipation system for an electronic device, comprising: (a) an electronic device comprising a heat source (e.g. a heat-generating component, such as a CPU or battery, in a computing device), wherein the heat source transmits heat to a second component or an external surface of the electronic device; (b) a heat-conducting layer comprising two major surfaces, the heat-conducting layer being positioned in such a manner that one of its major surfaces is in operative contact with the heat source such that the heat-conducting layer is interposed between the heat source and the second component or the external surface of the electronic device. The heat-conducting layer comprises at least one sheet of integrated graphene film which thermally shields the external surface or the second component of the electronic device from heat generated by the heat source. The second component can be any functional circuit component that is heat-sensitive. Many of these components are sensitive to heat since the electron conducting behavior of a diode or transistor is highly dependent upon temperature.

The integrated graphene film may be obtained from a graphene oxide gel or graphene oxide gel-bonded nano graphene platelets (NGPs). The graphene oxide gel may be advantageously prepared by heavily oxidizing graphite powder in a strong acid and/or oxidizer. NGPs may be obtained from exfoliation and separation of a graphite intercalation compound (GIC), or directly from "direct ultrasonication" of graphite without going through any oxidation or intercalation.

Graphite is made up of layer planes of hexagonal networks of carbon atoms. These layer planes of hexagonally arranged carbon atoms are substantially flat and are oriented or ordered so as to be substantially parallel and equidistant to one another. These layers of carbon atoms, commonly referred to as graphene layers or basal planes, are weakly bonded together in their thickness direction by weak van der Waals forces and groups of these graphene layers are arranged in crystallites. A highly ordered graphite material consists of crystallites of considerable size: the crystallites being highly aligned or oriented with respect to each other and having well ordered carbon layers. These anisotropic structures give rise to many properties that are highly directional, such as thermal and electrical conductivity.

The graphite structure is usually characterized in terms of two axes or directions: the "c" axis or direction and the "a" axes or directions. The "c" axis is the direction perpendicular to the basal planes. The "a" axes are the directions parallel to the basal planes (perpendicular to the "c" direction). The graphite used for manufacturing flexible graphite sheets is typically exfoliated natural graphite that possesses a high degree of orientation.

Due to the weak van der Waals forces holding the parallel graphene layers, natural graphite can be treated so that the spacing between the graphene layers can be appreciably opened up so as to provide a marked expansion in the "c" direction, and thus form an expanded graphite structure in which the laminar character of the carbon layers is substantially retained. The process for manufacturing flexible graphite is well-known and the typical practice is described in U.S. Pat. No. 3,404,061 to J. H. Shane, et al., the disclosure of which is incorporated herein by reference. In general, flakes of natural graphite are intercalated in an acid solution to produce graphite intercalation compounds (GICs). The GICs are washed, dried, and then exfoliated by exposure to a high temperature for a short period of time. This causes the flakes to expand or exfoliate in the "c" direction of the graphite up to 80-300 times of their original dimensions. The exfoliated graphite flakes are vermiform in appearance and, hence, are commonly referred to as worms. These worms of graphite flakes which have been greatly expanded can be formed without the use of a binder into cohesive or integrated sheets of expanded graphite, e.g. webs, papers, strips, tapes, foils, mats or the like (typically referred to as "flexible graphite") having a typical density of about 0.04-2.0 g/cm$^3$ for most applications.

The upper left portion of FIG. 1 shows a flow chart that illustrates the prior art processes used to fabricate flexible graphite and the resin-impregnated flexible graphite composite. The processes typically begin with intercalating graphite particles 20 (e.g., natural graphite or synthetic graphite flakes) with an intercalant (typically a strong acid or acid mixture) to obtain a graphite intercalation compound 22 (GIC). After rinsing in water to remove excess acid, the GIC becomes "expandable graphite." The GIC or expandable graphite is then exposed to a high temperature environment (e.g., in a tube furnace preset at a temperature in the range of 800-1,050° C.) for a short duration of time (typically from 15 seconds to 2 minutes). This thermal treatment allows the graphite to expand in its "c" direction by a factor of 30 to several hundreds to obtain a worm-like vermicular structure, which contains exfoliated, but un-separated graphite flakes 24 with large pores interposed between these interconnected flakes.

In one prior art process, the exfoliated graphite is re-compressed by using a calendering or roll-pressing technique to obtain flexible graphite sheets or foils 26, which are typically much thicker than 100 μm. It seems that no flexible graphite sheet thinner than 75 μm has ever been reported in the open literature or patent documents. Commercially available flexible graphite sheets normally have a thickness greater than 0.125 mm (125 μm), an in-plane electrical conductivity of 1-3×10$^3$ S/cm, through-plane (thickness-direction) electrical conductivity of 15-30 S/cm, in-plane thermal conductivity of 140-450 W/(mK), and through-plane thermal conductivity of approximately 5 W/(mK). These properties are inadequate for many thermal management applications and the present invention is made to address these issues.

In another prior art process, the exfoliated graphite worm 24 may be impregnated with a resin and then compressed and cured to form a flexible graphite composite 28, which is normally of low strength.

The exfoliated graphite may be subjected to high-intensity mechanical shearing/separation treatments using an air mill, ball mill, or ultrasonic device to produce separated nano-scaled graphene plates 34 (NGPs) with all the graphite platelets thinner than 100 nm, mostly thinner than 10 nm. An NGP is composed of a graphene sheet or a plurality of graphene sheets with each sheet being a two-dimensional, hexagonal carbon structure.

For the purpose of defining the geometry and orientation of an NGP, the NGP is described as having a length (the largest dimension), a width (the second largest dimension), and a thickness. The thickness is the smallest dimension, which is no greater than 100 nm, preferably smaller than 10 nm in the present application. When the platelet is approximately circular in shape, the length and width are referred to as diameter. In the presently defined NGPs, both the length and width can be smaller than 1 μm, but can be larger than 200 μm.

In addition to graphene or NGPs, another ingredient of the presently invented composite thin film composition is graphene oxide (GO), which is obtained from a graphene oxide gel. This gel is obtained by immersing a graphitic material 20 in a powder or fibrous form in a strong oxidizing liquid in a reaction vessel to form an optically opaque suspension or slurry (an inhomogeneous mixture of solid and liquid ingredients). The reaction between graphite powder and the oxidizing agent is allowed to proceed at a reaction temperature for a length of time sufficient to transform this opaque suspension into a translucent or transparent solution, which is now a homogeneous fluid called "graphene oxide gel."

This graphene oxide gel is optically transparent or translucent and visually homogeneous with no discernible discrete graphene or graphene oxide sheets dispersed therein. It is essentially a homogeneous solution. In contrast, conventional suspension of discrete graphene sheets, graphene oxide sheets, and expanded graphite flakes look dark, black or heavy brown in color with individual graphene or graphene oxide sheets or expanded graphite flakes discernible or recognizable with naked eyes. These clearly identifiable flakes are suspended in a fluid when one shakes the container; however, these flakes are highly sedimentary and become a sedimentation settled at the bottom of the container soon after the shaking action is ceased.

The graphene oxide molecules dissolved in a graphene oxide gel are aromatic chains that have an average number of benzene rings in the chain typically less than 1000, more typically less than 500, and most typically less than 100. Most of the molecules have more than 5 or 6 benzene rings (mostly >10 benzene rings) from combined atomic force microscopy, high-resolution TEM, and molecular weight measurements. Based on our elemental analysis, these benzene-ring type of aromatic molecules are heavily oxidized, containing a high concentration of functional groups, such as —COOH and —OH and, therefore, are "soluble" (not just dispersible) in polar solvents, such as water. The estimated molecular weight of these graphene oxide polymers in the gel state is typically between 200 g/mole and 43,000 g/mole, more typically between 400 g/mole and 21,500 g/mole, and most typically between 400 g/mole and 4,000 g/mole.

These soluble molecules behave like polymers and are surprisingly capable of serving as a binder or adhesive that bonds NGPs together to form a composite thin film of good structural integrity and high thermal conductivity. Conventional discrete graphene or graphene oxide sheets do not have any binding or adhesion power.

The graphene oxide gel can be cast onto a smooth surface (e.g. surface of a piece of glass) and transformed into a solid graphene oxide film by removing the liquid component of the gel. This solid film may be subjected to a heat treatment at a temperature in a range of 100-1,500° C. (up to 3,200° C. if so desired), more typically in the range of 300-1,000° C., and most preferably in the range of 300-700° C. Quite surprisingly, graphene oxide molecules appear to be capable of re-joining or merging with one another to become giant molecules of essentially infinite molecular weight. The resulting film has just one or a few graphene grains (per layer) that are reminiscent of the original graphene oxide sheets. In other words, thousands of discrete graphene oxide molecules (obtained through heavy oxidation of originally thousands of discrete graphite flakes) are now united or integrated into just a few giant graphene sheets.

The present invention provides a graphene composite thin film composition for use as a heat-dissipating layer in an electronic device. The graphene composite film is composed of nano graphene platelets (NGPs) bonded by a graphene oxide binder, wherein the NGPs contain single-layer graphene or multi-layer graphene sheets having a thickness from 0.335 nm to 100 nm, and the NGPs occupy a weight fraction of 1% to 99.9% of the total composite weight; and the graphene oxide binder occupies a weight fraction of 0.1% to 99% of the total composite weight, and wherein the composite forms a thin film with a thickness no greater than 1 mm, preferably less than 200 µm, further preferably less than 100 µM. More preferably, the thickness is greater than 10 µm, further preferably between 10 and 100 µm, and most preferably between 10 µm and 50 µm. A thickness less than 10 µm would make it impossible to handle the composite thin film when attempting to incorporate pieces of the composite thin film in a device for thermal management applications (e.g. as a heat spreader in a microelectronic device). The graphene oxide has an oxygen content of typically 20-40% by weight based on the total graphene oxide weight when it is in a gel state. Upon completion of a final heat treatment, the oxygen content in the graphene oxide is typically less than 10% and most typically (and desirably) less than 2% by weight.

The multi-layer graphene sheets preferably have a thickness of 3.35 nm to 33.5 nm and the resulting composite film has a thickness no greater than 100 µm. When multi-layer graphene sheets have a thickness of 6.7 nm to 20 nm, one can readily produce a composite film having a thickness not greater than 50 µm.

The graphene oxide-bonded graphene composite thin film composition desirably contains pristine graphene containing no oxygen. The pristine graphene can be obtained from direct ultrasonication without involving oxidation of a graphitic material. The graphene oxide (GO) binder used for this composite also has an oxygen content of <10% by weight based on the total graphene oxide weight. The GO binder, when in a gel state, typically has an oxygen content of 20-46% by weight. After combining with NGPs to form a composite thin film and thermally treating this composite film, the process naturally reduces the oxygen content to typically <10% by weight and, in most cases, less than 2% by weight.

The graphene oxide binder occupies a weight fraction of 1% to 20% of the total composite weight. The graphene oxide is obtained from a graphene oxide gel, which gel is composed of graphene oxide molecules dispersed in an acidic medium having a pH value of no higher than 5 and the graphene oxide molecules have an oxygen content no less than 20% by weight. In particular, the gel is obtained by immersing a graphitic material in a powder or fibrous form in an oxidizing liquid in a reaction vessel at a reaction temperature for a length of time sufficient to obtain a graphene oxide gel composed of graphene oxide molecules dispersed in an acidic medium having a pH value of no higher than 5 and the graphene oxide molecules have an oxygen content no less than 20% by weight. The graphene composite is obtained by mixing the NGPs in the graphene oxide gel to form a NGP-graphene oxide mixture suspension, making the suspension into a thin film form, and removing the residual liquid from the mixture suspension.

The starting graphitic material for the purpose of forming graphene oxide gel may be selected from natural graphite, artificial graphite, meso-phase carbon, meso-phase pitch, meso-carbon micro-bead, soft carbon, hard carbon, coke, carbon fiber, carbon nano-fiber, carbon nano-tube, or a combination thereof. The graphitic material is preferably in a powder or short filament form having a dimension lower than 20 µm, more preferably lower than 10 µm, further preferably smaller than 5 µm, and most preferably smaller than 1 µm.

Using artificial graphite with an average particle size of 9.7 µm as an example, a typical procedure involves dispersing graphite particles in an oxidizer mixture of sulfuric acid, nitric acid, and potassium permanganate (at a weight ratio of 3:1:0.05) at a temperature of typically 0-60° C. for typically at least 3 days, preferably 5 days, and more preferably 7 days or longer. The average molecular weight of the resulting graphene oxide molecules in a gel is approximately 20,000-40,000 g/mole if the treatment time is 3 days, <10,000 g/mole if 5 days, and <4,000 g/mole if longer than 7 days. The required gel formation time is dependent upon the particle size of the original graphitic material, a smaller size requiring a shorter time. It is of fundamental significance to note that if the critical gel formation time is not reached, the suspension of graphite powder and oxidizer (graphite particles dispersed in the oxidizer liquid) appears completely opaque, meaning that discrete graphite particles remain suspended (but not dissolved) in the liquid medium. As soon as this critical time is exceeded, the whole suspension becomes optically translucent or transparent, meaning that the heavily oxidized graphite completely lost its original graphite identity and the resulting graphene oxide molecules are completely dissolved in the oxidizer liquid, forming a homogeneous solution (no longer just a suspension or slurry).

It must be further noted that if the suspension or slurry, with a treatment time being shorter than the required gel formation time, is rinsed and dried, we would simply recover a graphite oxide powder or graphite intercalation compound (GIC) powder, which can be exfoliated and separated to produce nano graphene platelets (NGPs).

Hence, the NGPs may be produced by subjecting a graphitic material to a combined treatment of oxidation, exfoliation, and separation. This graphitic material may also be selected from natural graphite, artificial graphite, meso-phase carbon, meso-phase pitch, meso-carbon micro-bead, soft carbon, hard carbon, coke, carbon fiber, carbon nano-fiber, carbon nano-tube, or a combination thereof. The NGPs can also be produced from a process such as (a) direct ultrasonication, (b) potassium melt intercalation and water/alcohol-induced exfoliation, or (c) supercritical fluid intercalation/exfoliation/separation of non-oxidized graphitic material. These processes produce pristine graphene that contains no oxygen The graphene composite thin film composition typically has a thermal conductivity greater than 800 $Wm^{-1}K^{-1}$, more typically greater than 1,000 $Wm^{-1}K^{-1}$ (even when the film thickness is greater than 10 µm) and often greater than 1,700 $Wm^{-1}K^{-1}$. The composite thin film has an electrical conductivity greater than 3,000 S/cm. This high electrical conductivity (greater than 3000 S/cm) can be achieved concurrently with a thermal conductivity greater than 1,000 $Wm^{-1}K^{-1}$. Quite often, the composite thin film can exhibit a combination of a high electrical conductivity (greater than 1,500 S/cm), a high thermal conductivity (greater than 600 $Wm^{-1}K^{-1}$), a relatively high physical density (greater than 1.4 $g/cm^3$), and a relatively high tensile strength (greater than 10 MPa).

Quite surprisingly, in many samples, the composite thin film has an electrical conductivity greater than 2,000 S/cm, a thermal conductivity greater than 800 $Wm^{-1}K^{-1}$, a physical density greater than 1.8 $g/cm^3$, and a tensile strength greater than 40 MPa. This combination of superior properties has not been achieved with any graphite or non-graphite material. In some cases, the composite thin film has an electrical conductivity greater than 3,000 S/cm, a thermal conductivity greater than 1,500 $Wm^{-1}K^{-1}$, a physical density greater than 2.0 $g/cm^3$, and a tensile strength greater than 40 MPa. This type of graphene composite film may be used as a heat spreader component in a portable device.

An embodiment of the heat-conducting layer of the present invention is a sheet of integrated graphene film or GO-bonded NGP composite film, having two major surfaces. One of the major surfaces is sized to be positioned in operative contact with a heat source (e.g, CPU, hard drive, chipset, or battery pack) of a cellular phone, laptop computer, or other portable computing device so that the heat generated by heat source can dissipates into this heat-conducting layer. The area of the major surface which is in contact with the heat source may be greater than the area of contact with the heat source, so that the heat-conducting layer can spread the heat from the heat source more effectively.

Optionally, one of the major surfaces of the heat-conducting layer can be in operative contact with a heat dissipation device, such as a heat sink, heat pipe, heat plate, etc. The heat dissipation device can contact the heat-conducting layer on either the same major surface as the heat source or the opposing major surface. Because of the anisotropic nature of the integrated graphene film, heat from the heat source is thereby spread to the heat dissipation device to thus effectively disperse the heat generated. In this way, the heat-conducting layer acts as a heat spreader to spread the heat generated by heat source, including spreading the heat to the optional heat dissipation device, without undesirably discharging heat into other heat-sensitive components of the electronic device.

Due to the exceptionally high thermal conductivity of the integrated graphene film or GO-graphene composite film, heat from the heat source is not allowed to transmit directly through the plane of the heat-conducting layer from the one of the major surfaces in operative contact with the heat source to the other. Therefore, heat is essentially prevented from transmitting to a second component (which is heat sensitive) or an external surface of the device in which the heat source is located (such as a laptop computer or a mobile phone), reducing the temperature of such external surface (by as much as 12 degree C. or more in some cases), when the integrated graphene film is disposed between the heat source and the external surface. In contrast, by implementing a sheet of commercial flexible graphite foil in a comparable configuration, we observed a temperature reduction by 3 degrees only. It is of significance to note that a temperature hike by 12 degrees on an exterior surface could easily mean a severe hot spot near the heat source of a sensitive electronic device. The hot spot can be severe enough to cause a malfunction of the device or even a thermal runaway of a battery pack inside the device.

An electronic device may have, under its protective case, a number of components, including one or more heat-generating components. In addition, a computing device (e.g. laptop computer) may have a heat dissipation device, such as a heat sink. Due to space constraints, it is not always possible to position a heat sink adjacent a heat source. One may choose to position the heat-conducting layer in such a manner that it overlays both the heat source and the heat sink. With such a configuration, heat can flow from the heat source to the heat sink for dissipation. Moreover, because of the relatively low through-plane thermal conductivity of the integrated graphene film, heat does not flow through the heat-conducting layer effectively, preventing overheating of the environment shielded by the heat-conducting layer. This would not be possible if a more isotropic material such as copper or aluminum were used.

Further, due to the flexible nature of the integrated graphene film, the heat-conducting layer can conform to the contours of the components within an electronic device, thus not requiring very much additional space. In contrast, a more rigid material like copper or aluminum would not as easily be able to do the same. Furthermore, the ability to produce integrated graphene film into a thickness in the range of 10-60 µm (as opposed to flexible graphite sheets that are typically thicker than 125 µm), can help save lots of space. This is a critically important feature in view of the ever-increasing demand by microelectronic device producers to further reduce the thickness and weight of a smart phone or other portable device.

Another undesirable practice in the smart phone production industry is the notion that up to four sheets of flexible graphite (FG) foil per smart phone are used due to the inability of fewer FG sheets to effectively dissipate the heat and adequately shield the heat from nearby heat-sensitive components. This also creates bulkiness, weight, and cost issues. We have surprisingly observed that one sheet of GO bonded NGP composite film with a thermal conductivity >1800 W/mK and approximately 50 µm in thickness works better than 4 sheets of FG foil each of 125 µm thick. This is an undeniably impressive result.

We have further observed that flexible graphite sheets have some additional challenging issues when used as a heat spreader. The FG foil lacks mechanical integrity and, hence, difficult to handle. Furthermore, the FG foil has a great tendency to have graphite particles flaking from or even separated from the FG foil surface, creating internal shorting problem for the electronic device. In order to alleviate these problems, the FG supplier typically has to apply a protective coating to the surface of FG foil. We have found it unnecessary to implement protective coating onto a surface of our integrated graphene film for the purpose of improving the handleability and mechanical robustness of the heat-conducting layer. There is also no flaking problem when handling our integrated graphene film.

However, some electrically insulating coating or protective film may be used in those applications where a direct electric contact of the graphene film with a sensitive component (e.g. CPU) is undesirable. Protective coating can be selected from any electrically insulating polymer, such as epoxy, polyethylene, polyester or polyimide. Once an integrated graphene film is made, a protective coating can be applied by various commonly used coating methods, such as spray coating, roller coating, hot laminating press, mechanical mapping, and lamination.

A practical process for producing a graphene oxide-bonded graphene composite film includes: (a) preparing single-layer or multilayer graphene platelets from a graphitic material; (b) preparing a graphene oxide gel having graphene oxide molecules dispersed in an acidic fluid medium; (c) mixing the graphene platelets in the graphene oxide gel to form a composite gel; and (d) forming a composite gel into a composite thin film by removing the fluid medium.

The graphene platelets preferably are pristine graphene containing no oxygen. The pristine graphene is prepared from a graphitic material without involving oxidation of graphite.

As illustrated in FIG. 1, the graphene oxide gel is prepared by immersing a graphitic material in a powder or fibrous form in a strong oxidizing liquid in a reaction vessel at a reaction temperature for a length of time sufficient to obtain a graphene oxide gel composed of graphene oxide molecules dispersed in an acidic medium having a pH value of no higher than 5 and the graphene oxide molecules have an oxygen content no less than 20% by weight. Such a graphitic material is selected from natural graphite, artificial graphite, meso-phase carbon, meso-phase pitch, meso-carbon micro-bead, soft carbon, hard carbon, coke, carbon fiber, carbon nano-fiber, carbon nano-tube, or a combination thereof.

The nano graphene platelets may be produced from a graphitic material selected from natural graphite, artificial graphite, meso-phase carbon, meso-phase pitch, meso-carbon micro-bead, soft carbon, hard carbon, coke, carbon fiber, carbon nano-fiber, carbon nano-tube, or a combination thereof. The starting material may be immersed in a mixture of sulfuric acid, nitric acid, and potassium permanganate to allow for intercalation of acid into interior of the graphitic, resulting in the formation of graphite intercalation compound (GIC) after rinsing and drying. The GIC is then exfoliated in a high temperature furnace to obtain exfoliated graphite, which is then subjected to mechanical shearing to obtain isolated NGPs. Multi-layer graphene sheets having a thickness of 6.7 nm to 20 nm in the composite thin film having a thickness not greater than 50 µm appears to exhibit an exceptionally high thermal conductivity value.

For the preparation of graphene oxide gel-bonded graphene composite thin film, the discrete NGPs (preferably thinner than 20 nm, more preferably thinner than 10 nm) are dispersed in a graphene oxide gel to produce a suspension wherein discrete graphene platelets (NGPs) are suspended in the oxidizer mixture liquid 36 (FIG. 1), in which graphene oxide molecules are dissolved as well. The graphene platelet concentration is preferably lower than 50% by weight in the suspension (most preferably smaller than 20%). The suspension (or slurry) is allowed to form into thin film structures using techniques like solvent cast, vacuum-assisted filtration, spin coating, dip coating, or paper-making. Upon removal of the liquid medium, the resulting thin-film structures 40 contain discrete graphene platelets being dispersed in a polymer binder matrix (graphene oxide molecules). This thin-film structure is then subjected to a thermal treatment or re-graphitization treatment (typically 100-1000° C., but can be higher), which allows individual graphene oxide molecules to chemically bond to graphene sheets or platelets. This thermal treatment also surprisingly enables or activates the re-joining, polymerization, or chain-growth of otherwise small graphene oxide molecules, resulting in removal of non-carbon elements (e.g. H and O) and formation of large graphene sheets. The presence of discrete NGPs provides "nucleation sites" to accelerate the growth of these huge graphene sheets. It appears that the original NGPs (discrete graphene platelets) and graphene oxide molecules can be merged and integrated into one unitary entity that exhibits an unprecedented combination of exceptional thermal conductivity, electrical conductivity, structural integrity (strength and ease of handling). These properties are unmatched by any graphitic or non-graphitic materials.

The thermal treatment process can be assisted with a calendering or roll-pressing operation to help improve the surface finish of the resulting thin film. The film thickness can be less than 10 µm, but preferably between 10 µm and 100 µm.

Thus, the present invention also provides a process for producing graphene-oxide-bonded pristine graphene composite 42 (FIG. 1), which involves mixing discrete NGPs in said graphene oxide gel to form a NGP-graphene oxide mixture suspension 38, making the suspension into a thin film form, removing a residual liquid from the mixture suspension, and subjecting the thin film 42 to a re-graphitization treatment at a temperature in the range of 100° C. and 3,200° C. The re-graphitization temperature is preferably in the range of 300° C. and 1,500° C. or in the range of 300° C. and 1,000° C. The thin film composition can form into a unitary structure after the re-graphitization treatment.

It may be further noted that graphene oxide gel is chemically converted into different graphene compositions at different temperatures for a different periods of time. Depending upon the treatment temperature and time, the oxygen content can vary between essentially 0% and about 10%. Quite surprisingly, the electrical and thermal conductivities of the integrated graphene film prepared from a graphene oxide gel exhibits a sudden spike when the oxygen content is below 2%. We do not have a good explanation for such an unexpected result.

As indicated above, flexible graphite sheets prepared by re-compression of exfoliated graphite or graphite worms exhibit relatively low thermal conductivity and mechanical strength. The graphite worms can be formed into flexible graphite sheets by compression, without the use of any binding material, presumably due to the mechanical interlocking between the voluminously expanded graphite flakes. Although a significant proportion of these flakes are oriented in a direction largely parallel to the opposing surfaces of a flexible graphite sheet (as evidenced by the high degree of anisotropy with respect to thermal and electrical conductivity), many other flakes are distorted, kinked, bent over, or oriented in a direction non-parallel to these sheet surfaces. This observation has been well demonstrated in many scanning electron micrographs (SEM) published in open or patent literature. Furthermore, the presence of a large number of graphite flakes implies a large amount of interface between flakes, resulting in very high contact resistance (both thermal and electrical resistance).

As a consequence, the electrical or thermal conductivity of the resulting flexible graphite sheets dramatically deviates from what would be expected of a perfect graphite single crystal or a graphene layer. For instance, the theoretical in-plane electrical conductivity and thermal conductivity of a graphene layer are predicted to be $1-5 \times 10^4$ S/cm and 3,000-5,000 W/(mK), respectively. However, the actual corresponding values for flexible graphite are $1-3 \times 10^3$ S/cm and 140-300 W/(mK), respectively; one order of magnitude lower than what could be achieved. By contrast, the corresponding values for the presently invented graphene-oxide bonded graphene composite films are $3.5-10 \times 10^3$ S/cm and 600-2,230 W/(mK), respectively.

Example 1

Preparation of Nano Graphene Platelets (NGPs)

Chopped graphite fibers with an average diameter of 12 µm was used as a starting material, which was immersed in a mixture of concentrated sulfuric acid, nitric acid, and potassium permanganate (as the chemical intercalate and oxidizer) to prepare graphite intercalation compounds (GICs). The fiber segments were first dried in a vacuum oven for 24 h at 80° C. Then, a mixture of concentrated sulfuric acid, fuming nitric acid, and potassium permanganate (at a weight ratio of 4:1:0.05) was slowly added, under appropriate cooling and stirring, to a three-neck flask containing fiber segments. After 16 hours of reaction, the acid-treated graphite fibers were filtered and washed thoroughly with deionized water until the pH level of the solution reached 6. After being dried at 100° C. overnight, the resulting graphite intercalation compound (GIC) was subjected to a thermal shock at 1050° C. for 45 seconds in a tube furnace to form exfoliated graphite (worms). Five grams of the resulting exfoliated graphite (EG) were mixed with 2,000 ml alcohol solution consisting of alcohol and distilled water with a ratio of 65:35 for 12 hours to obtain a suspension. Then the mixture or suspension was subjected to ultrasonic irradiation with a power of 200 W for various times. After two hours of sonication, EG particles were effectively fragmented into thin NGPs. The suspension was then filtered and dried at 80° C. to remove residue solvents. The as-prepared NGPs have an average thickness of approximately 9.7 nm.

Example 2

Preparation of Single-Layer Graphene from Meso-Carbon Micro-Beads (MCMBs)

Meso-carbon microbeads (MCMBs) were supplied from China Steel Chemical Co. This material has a density of about 2.24 g/cm$^3$ with a median particle size of about 16 μm. MCMB (10 grams) were intercalated with an acid solution (sulfuric acid, nitric acid, and potassium permanganate at a ratio of 4:1:0.05) for 72 hours. Upon completion of the reaction, the mixture was poured into deionized water and filtered. The intercalated MCMBs were repeatedly washed in a 5% solution of HCl to remove most of the sulphate ions. The sample was then washed repeatedly with deionized water until the pH of the filtrate was neutral. The slurry was dried and stored in a vacuum oven at 60° C. for 24 hours. The dried powder sample was placed in a quartz tube and inserted into a horizontal tube furnace pre-set at a desired temperature, 1,080° C. for 45 seconds to obtain a graphene material. TEM and atomic force microscopic studies indicate that most of the NGPs were single-layer graphene.

Example 3

Preparation of Pristine Graphene

In a typical procedure, five grams of graphite flakes, ground to approximately 20 μm or less in sizes, were dispersed in 1,000 mL of deionized water (containing 0.1% by weight of a dispersing agent, Zonyl® FSO from DuPont) to obtain a suspension. An ultrasonic energy level of 85 W (Branson S450 Ultrasonicator) was used for exfoliation, separation, and size reduction of graphene sheets for a period of 15 minutes to 2 hours.

Example 4

Preparation of Graphene Oxide Gel

Graphite oxide gel was prepared by oxidation of graphite flakes with an oxidizer liquid consisting of sulfuric acid, sodium nitrate, and potassium permanganate at a ratio of 4:1:0.05 at 30° C. When natural graphite flakes (particle sizes of 14 μm) were immersed and dispersed in the oxidizer mixture liquid, the suspension or slurry appears optically opaque and dark. The suspension remains opaque during the first 52 hours of reaction. However, the suspension gradually turns optically translucent (a little cloudy) when the reaction time exceeds 52 hours, and the color of the suspension changes from black to dark brown. After 96 hours, the suspension suddenly becomes an optically transparent solution with light brown color. The solution appears very uniform in color and transparency, indicating the absence of any dispersed discrete objects. The whole solution behaves like a gel, very similar to a typical polymer gel.

Surprisingly, by casting this gel on a glass surface and removing the liquid medium from the cast film we obtain a thin film of graphene oxide that is optically transparent. This thin film looks like and behaves like a regular polymer film.

Example 5

Preparation of Graphene Oxide Bonded Graphene Composite Thin-Film

The NGPs prepared in Examples 1-3 and the graphene oxide gel prepared in Example 4 were used for the preparation of graphene oxide-bonded graphene composite. Fully separated NGP platelets were dispersed in graphene oxide gel to produce a graphene platelet suspension with the platelet concentration of approximately 1-50% by weight (preferably 5-20% by weight NGP). Ultrasonic waves were employed to assist in the dispersion of NGPs in the gel. This NGP-gel suspension or slurry was then cast onto a glass surface and regulated by a doctor's blade to form a film of uniform thickness. The liquid in the film was then removed in a vacuum oven to form a solid composite film.

Some selected solid films were subjected to a heat treatment (re-graphitization treatment) at a temperature of 100-1, 500° C. (in some cases, 1,500-2,800° C., for comparison purposes) for 2-4 hours. For comparison, we also carbonized polyimide films at 1000° C. for 3 hours in an inert atmosphere and then graphitized the films at a temperature in the range of 2,500-3,000° C. for 5 hours to form a conventional graphitic film. Flexible graphite sheets were also obtained from commercial sources as another baseline material.

Figure 3A:
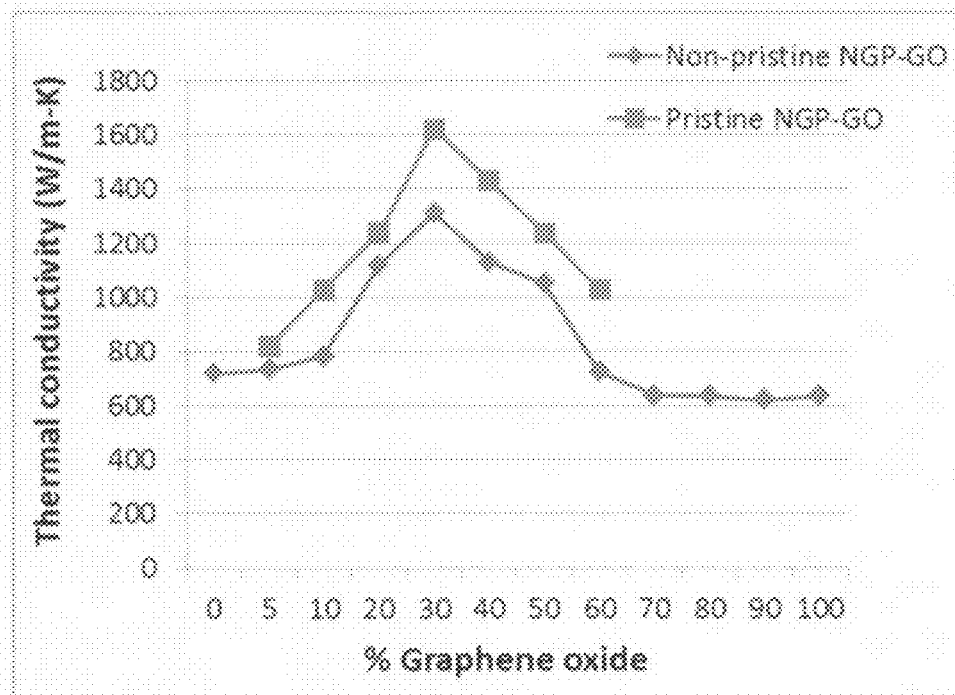
FIG. 3 (A) Thermal conductivity, (B) electrical conductivity, and (C) tensile strength of GO gel bonded NGP composites as a function of the GO content in the composite.

The in-plane thermal and electrical conductivities and tensile properties of various films were investigated. Several significant observations can be made from the testing results (e.g. as summarized in FIG. 3(A), (B), (C) and FIG. 4):

(1) At a thickness of approximately 45 μm the thermal conductivity of the graphene oxide-bonded NGP composite films (heat treated at 800° C. for 2 hours) increases from 720 W/(mK) at 0% GO binder (containing graphene sheets only) to reach a maximum of 1310 W/(mK) at 30% GO, as shown in FIG. 3(A). The thermal conductivity value begins to decrease with a further increase in the GO binder amount. This maximum thermal conductivity is significantly higher than that (720 W/mK) of the thin film made up of NGPs only (0% GO) and that of the film containing GO only (100% GO). These data have clearly demonstrated an un-expected, synergistic effect between NGP (graphene) and GO (graphene oxide).

(2) These graphene-based composite thin films exhibit much higher thermal conductivity values than those (typically 140-300 W/(mK)) of commercially available flexible graphite sheets.

Figure 3B:
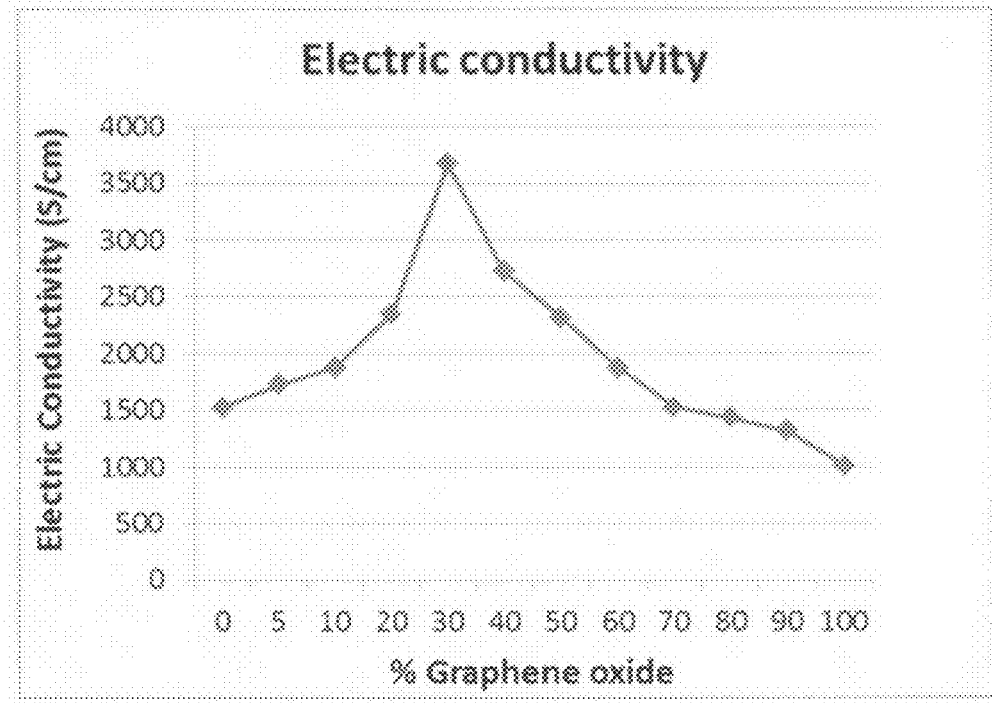
Figure 3C:
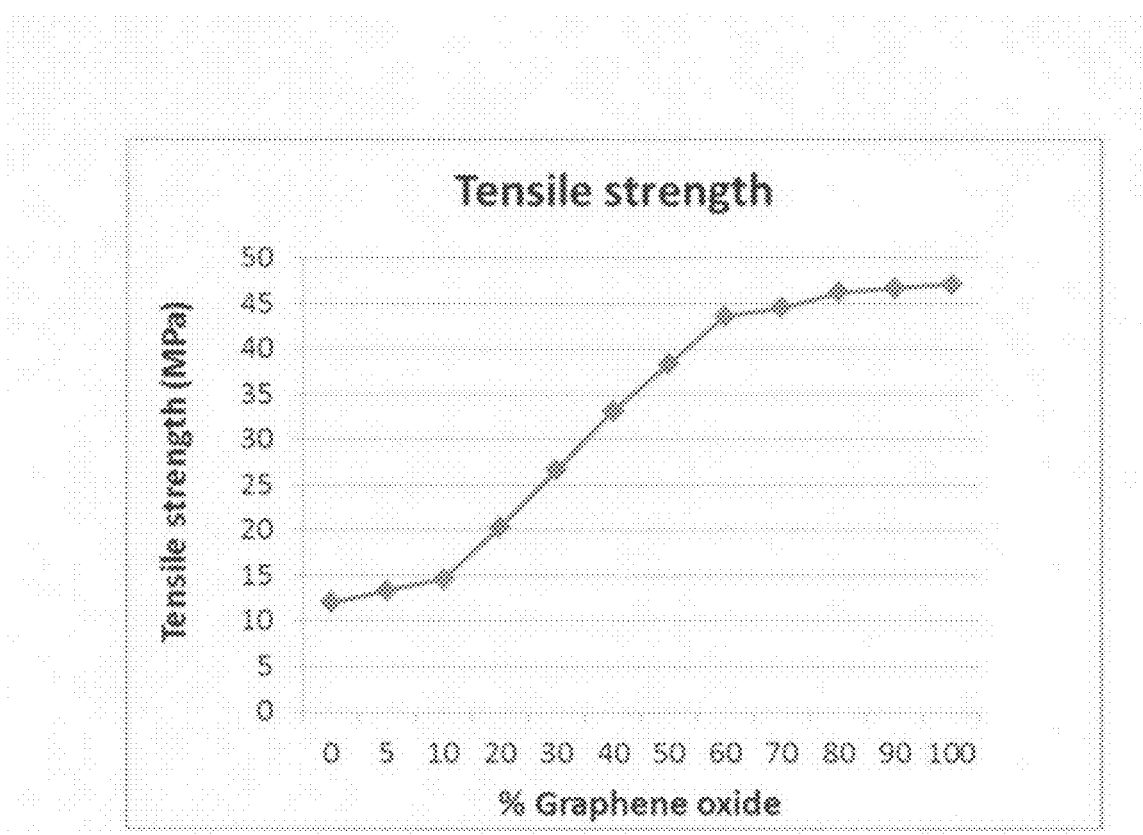

(3) FIG. 3(B) also shows a dramatic synergistic effect in electrical conductivity when graphene is combined with graphene oxide to form a composite material.

(4) Another unexpected observation is the notion that the tensile strength of the GO-NGP composite increases monotonically with the increasing GO content. This appears to suggest that GO gel has a strong adhering power capable of bonding graphene sheets or integrating with graphene sheets together, and that GO molecules in a GO gel are capable of combining with one another to form larger and stronger graphene/graphene oxide sheets that are relatively defect-free, leading to a relatively high mechanical strength.

(5) The presently invented GO-NGP composite and integrated GO can be readily produced into thin films much thinner than 100 μm (the practical lower limit of flexible graphite sheet thickness). Within the thickness range of 10-100 µm, the GO-NGP composite films exhibit an exceptionally high thermal conductivity of >1800 W/(mK) and the thermal conductivity is relatively independent of the film thickness (1820 W/mK at 24 µm, 1831 W/mK at 54 µm, and 1826 W/mK at 72 µm in thickness). It may be noted that NGPs alone (without GO gel as a binder), when packed into a film or paper sheet of non-woven aggregates, exhibit a thermal conductivity higher than 1,000 W/mK only when the film or paper is cast and pressed into a sheet having a thickness lower than 10 µm, and higher than 1,500 W/mK only when the film or paper is cast and pressed into a sheet having a thickness lower than 1 µm. This was reported in our earlier U.S. patent application Ser. No. 11/784,606 (Apr. 9, 2007). However, ultra-thin film or paper sheets (<10 µm) are difficult to produce in mass quantities, and difficult to handle when one tries to incorporate these thin films as a heat spreader material during the manufacturing of microelectronic devices. Further, thickness dependence of thermal conductivity (not being able to achieve a high thermal conductivity at a wide range of film thicknesses) is not a desirable feature.

(6) FIG. 3(A) also demonstrates that GO-bonded pristine graphene composite exhibits significantly higher thermal conductivity as compared to GO-bonded non-pristine NGP composites. The NGPs prepared from chemical oxidation or intercalation processes tend to have structural defects on graphene plane and have some non-carbon elements (e.g. oxygen and hydrogen). These NGPs are distinct from pristine NGPs (e.g. prepared from direct ultrasonication of graphite, alkali metal intercalation, and supercritical fluid extraction) in terms of chemical composition, microstructure, and properties).

Figure 4:
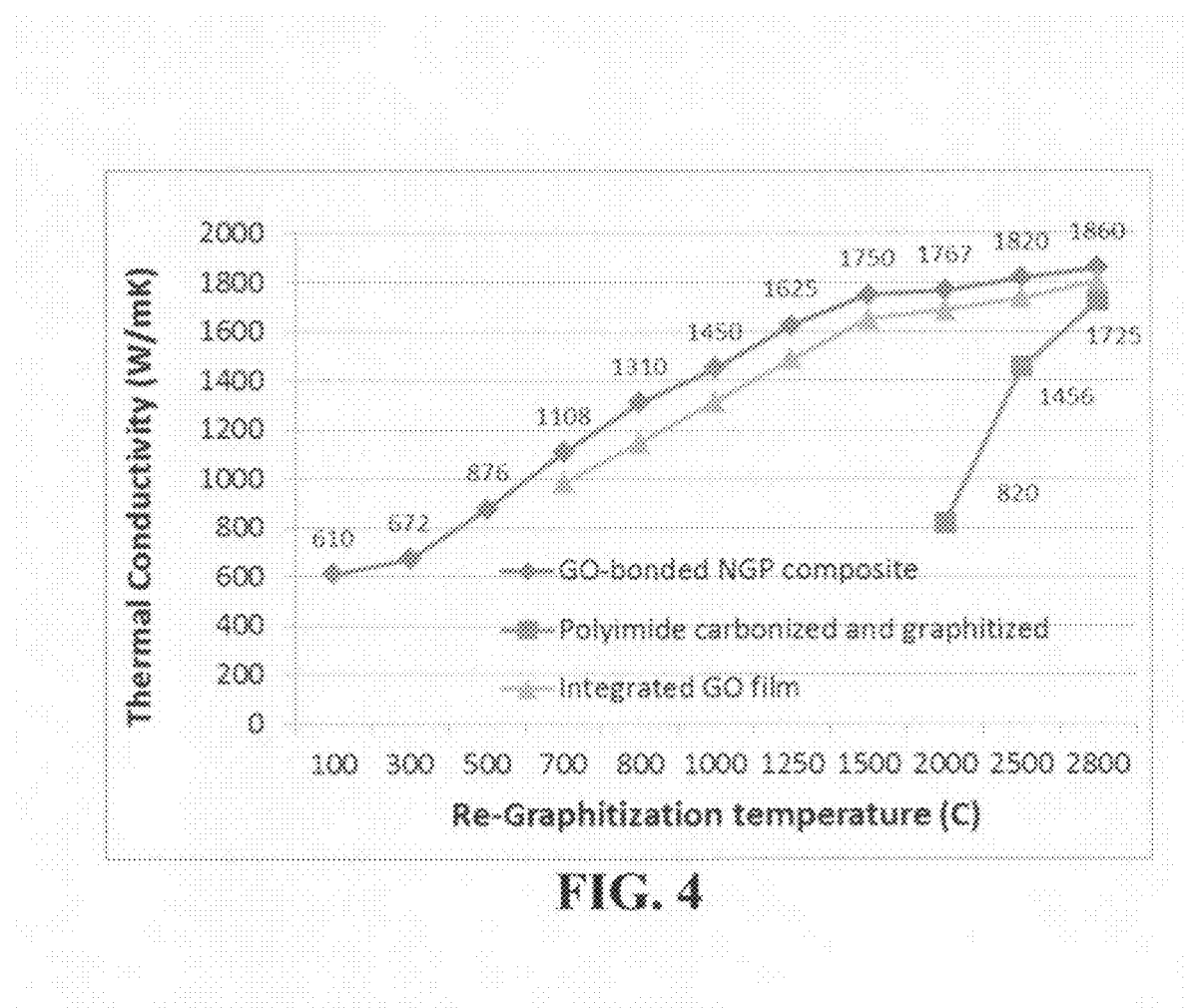
FIG. 4 Thermal conductivity values of GO gel bonded NGP composites, integrated graphene film from treated GO gel (heat treatment times 4 hours for GO and GO-NGP composite films), and polyimide-based graphitic films as a function of the heat treatment temperature (PI carbonization times of 3 hours followed by 5 hours of graphitization).

(7) As indicated in FIG. 4, the presently invented NGP-GO composite films and integrated GO films do not have to go through an ultra-high-temperature graphitization treatment. Graphitization of a carbonized resin (e.g. polyimide) or other carbon materials requires a temperature typically higher than 2,000° C., most typically higher than 2,500° C. The graphitization temperature is most typically in the range of 2,800-3,200° C. in order for carbonized materials or pyrolytic graphite to achieve a thermal conductivity >1,600 W/mK. In contrast, the typical heat treatment temperature (re-graphitization treatment) of the presently invented NGP-GO composites or integrated graphene film from GO is significantly lower than 1,500° C. and more typically lower than 1,000° (can be as low as 100° C.). For instance, carbonized polyimide, if graphitized at 2,000° C. for 5 hours, exhibits a thermal conductivity of 820 W/mK. In contrast, we were able to reach a thermal conductivity of 876 W/mK with a heat treatment of NGP-GO at 500° C. for 2-4 hours. This is very surprising and no one has ever thought that such a low graphitization temperature was possible. Clearly, this is a dramatically faster, less energy-intensive, and more cost-effective process.

(8) The integrated graphene films, without added NGPs, also outperform the pyrolytic graphite films graphitized from carbonized polymers by a huge margin. Again, a thermal conductivity as high as 983 W/mK was achieved with the integrated graphene film at a heat treatment temperature as low as 700° C. for 4 hours. The polyimide carbonized at 1,000° C. for 3 hours and graphitized at 2,000° C. for 5 hours only exhibits a thermal conductivity of 820 W/mK. This could not be and has not been anticipated by a person of ordinary skill in the art.

(9) In addition to the aforementioned quantitative data that has clearly demonstrated the stunning, superior performance of integrated graphene films and graphene-graphene oxide film, we have observed some very significant phenomenon that has been largely ignored or neglected. During this period of intensive and in-depth investigation of thermal management materials, we came to notice that flexible graphite sheets have a great tendency to become flaky and emit stray graphite flakes into the open air during handling (e.g. trying to get incorporated into an electronic device as a heat spreader). This not only creates undesirable air-borne particles that could be a health hazard, but also pose a shorting danger to the operation of an electronic device. These stray graphite flakes, being highly electrically conducting, can cause internal short-circuiting of sensitive devices. Our integrated films and GO-bonded NGP films do not have this issue.

(10) The use of an integrated graphene film as a heat-dissipating layer in an electronic device was found to significantly reduce the surface temperature of the electronic device by up to 10 degrees compared with the case when flexible graphite was used. This implies that the internal components could have been exposed to a hot spot even when flexible graphite sheets were used.

In conclusion, we have successfully developed two new and novel classes of highly conducting graphene-based heat-spreading materials: (1) integrated graphene film from graphene oxide gel; and (2) graphene oxide gel-bonded composites that contain non-pristine or pristine graphene sheets. The thermal and electrical conductivities and tensile strength exhibited by the presently invented materials are much higher than what prior art flexible graphite sheets or other graphitic films could achieve. The thermal and electrical conductivities exhibited by the presently invented materials are the highest of what graphite-type thin-layer materials (>10 µm) could achieve.

We claim:

1. A graphene-based heat dissipation system for an electronic device, comprising:
   (a) an electronic device comprising a heat source, wherein the heat source transmits heat to a second component or an external surface of the electronic device;
   (b) a heat-conducting layer comprising two major surfaces, the heat-conducting layer being positioned such that one of its major surfaces is in operative contact with the heat source such that it is interposed between the heat source and the second component or the external surface of the electronic device;
   wherein the heat-conducting layer consists of a graphene material which is made from one or more sheets of integrated graphene film which thermally shields the second component or the external surface of the electronic device from heat generated by the heat source, wherein said integrated graphene film is composed of chemically merged graphene oxide gel molecules that are merged in an edge-to-edge manner or graphene oxide gel-bonded nano graphene platelets (NGPs) and exhibits a thermal conductivity of at least 600 W/mK, and said integrated graphene film has at least one of the following features:
   i) having an oxygen content of at least 0.1% by weight, but less than 10% by weight;
   ii) having a single grain, a single crystal, or few grains that has no or few sheet-to-sheet grain boundaries per layer;

iii) having an electrical conductivity greater than 2,000 S/cm, a physical density greater than 2.0 g/cm$^3$, or a tensile strength greater than 40 MPa.

2. The system of claim 1, wherein said integrated graphene film is a graphene film formed from a graphene oxide gel or a graphene composite film formed of graphene oxide gel-bonded nano graphene platelets (NGPs) through a heat treatment conducted at a temperature from 100° C. to 3,200° C. that allows individual graphene oxide molecules or graphene oxide sheets to merge with one another in an edge-to-edge manner for forming an integrated graphene film.

3. The system of claim 1, wherein the electronic device further comprises a heat dissipation device positioned in a location not directly adjacent to the heat source and wherein one of the major surfaces of the heat-conducting layer is in operative contact with the heat dissipation device.

4. The system of claim 3, wherein the heat dissipation device comprises a heat sink, a heat pipe, a heat plate, or a combination thereof.

5. The system of claim 1, wherein the integrated graphene film has an in-plane thermal conductivity of at least 800 W/mK.

6. The system of claim 1, wherein the integrated graphene film has an in-plane thermal conductivity of at least 1,000 W/mK.

7. The system of claim 1, wherein the integrated graphene film has an in-plane thermal conductivity of at least 1,500 W/mK.

8. The system of claim 1, wherein the integrated graphene film further comprises a protective coating applied thereon.

9. The system of claim 1, wherein said integrated graphene film is a graphene composite film composed of nano graphene platelets (NGPs) bonded by a graphene oxide binder, wherein said NGPs contain single-layer graphene or multi-layer graphene sheets having a thickness from 0.335 nm to 100 nm, and said NGPs occupy a weight fraction of 1% to 99.9% of the total composite weight; and said graphene oxide binder, having an oxygen content of 0.1%-40% by weight based on the total graphene oxide weight, occupies a weight fraction of 0.1% to 99% of the total composite weight, and wherein said composite forms a thin film with a thickness no greater than 1 mm and no less than 1 μm.

10. The system of claim 1, wherein said integrated graphene film has a thickness less than 100 μm.

11. The system of claim 1, wherein said integrated graphene film has a thickness greater than 10 μm, but less than 100 μm.

12. The system of claim 9, wherein said multi-layer graphene sheets have a thickness of 6.7 nm to 20 nm or said composite thin film has a thickness not greater than 50 μm.

13. The system of claim 9, wherein said nano graphene platelets are pristine graphene containing no oxygen.

14. The system of claim 9, wherein said nano graphene platelets are pristine graphene containing no oxygen and said pristine graphene is obtained from an oxidation-free procedure selected from direct ultrasonication, supercritical fluid intercalation, or alkali metal intercalation.

15. The system of claim 9 wherein said graphene oxide binder has an oxygen content of 1-10% by weight based on the total graphene oxide weight which is measured after said graphene composite film composition is made.

16. The system of claim 9 wherein said graphene oxide binder occupies a weight fraction of 1% to 40% of the total composite film weight.

17. The system of claim 9 wherein said graphene oxide is obtained from a graphene oxide gel, which gel is composed of graphene oxide molecules dispersed in an acidic medium having a pH value of no higher than 5 and said graphene oxide molecules have an oxygen content no less than 20% by weight while in a gel state.

18. The system of claim 9 wherein said graphene oxide is obtained from a graphene oxide gel, which gel is obtained by immersing a graphitic material in a powder or fibrous form in an oxidizing liquid medium in a reaction vessel at a reaction temperature for a length of time sufficient to obtain a graphene oxide gel composed of graphene oxide molecules dispersed in the liquid medium and said graphene oxide molecules have an oxygen content no less than 20% by weight and a molecular weight less than 43,000 g/mole while in a gel state.

19. The system of claim 18 wherein said graphene oxide molecules have a molecular weight less than 4,000 g/mole.

20. The system of claim 18 wherein said graphene oxide molecules have a molecular weight between 200 g/mole and 4,000 g/mole.

21. The system of claim 18 wherein said graphene composite is obtained by mixing said NGPs in said graphene oxide gel to form a NGP-graphene oxide mixture suspension, making said suspension into a thin film form, and removing a residual liquid from said mixture suspension.

22. The system of claim 18 wherein said graphene composite is obtained by mixing said NGPs in said graphene oxide gel to form a NGP-graphene oxide mixture suspension, making said suspension into a thin film form, removing a residual liquid from said mixture suspension to form a solid mixture, and subjecting said solid mixture to a re-graphitization treatment at a temperature in the range from 100° C. to 3,200° C.

23. The system of claim 22 wherein said re-graphitization temperature is in the range from 300° C. to 1,500° C.

24. The system of claim 22 wherein said re-graphitization temperature is in the range from 100° C. and 1,000° C.

25. The system of claim 22 wherein said thin film composition forms into a unitary structure after said re-graphitization treatment.

26. The system of claim 18 wherein said graphitic material is selected from natural graphite, artificial graphite, meso-phase carbon, meso-phase pitch, meso-carbon micro-bead, soft carbon, hard carbon, coke, carbon fiber, carbon nano-fiber, carbon nano-tube, or a combination thereof.

27. The system of claim 9 wherein said NGPs are produced from a graphitic material selected from natural graphite, artificial graphite, meso-phase carbon, meso-phase pitch, meso-carbon micro-bead, soft carbon, hard carbon, coke, carbon fiber, carbon nano-fiber, carbon nano-tube, or a combination thereof.

28. The system of claim 9 wherein said integrated graphene film has an electrical conductivity greater than 3000 S/cm.

29. The system of claim 9 wherein said integrated graphene film has an electrical conductivity greater than 3000 S/cm and a thermal conductivity greater than 1,000 Wm$^{-1}$K$^{-1}$.

30. The system of claim 9 wherein said integrated graphene film has an electrical conductivity greater than 1,500 S/cm, a thermal conductivity greater than 600 Wm$^{-1}$K$^{-1}$, a physical density greater than 1.4 g/cm3, and a tensile strength greater than 10 MPa.

31. The system of claim 9 wherein said integrated graphene film has an electrical conductivity greater than 2,000 S/cm, a thermal conductivity greater than 800 Wm$^{-1}$K$^{-1}$, a physical density greater than 1.8 g/cm3, and a tensile strength greater than 40 MPa.

32. The system of claim 9 wherein said integrated graphene film has an electrical conductivity greater than 3,000 S/cm, a thermal conductivity greater than 1,500 Wm$^{-1}$K$^{-1}$, a physical density greater than 2.0 g/cm$^3$, and a tensile strength greater than 40 MPa.

33. The system of claim 1 wherein said integrated graphene film is a film produced from a graphene oxide gel, which is prepared by immersing a graphitic material in a powder or fibrous form in an oxidizing liquid to form an optically opaque suspension in a reaction vessel at a reaction temperature for a length of time sufficient to obtain a graphene oxide gel that is optically transparent or translucent, wherein said graphene oxide gel is composed of graphene oxide molecules dispersed in an acidic medium having a pH value of no higher than 5 and said graphene oxide molecules have an oxygen content no less than 20% by weight.

34. The system of claim 1 wherein said integrated graphene film is a film produced from a graphene oxide gel, which is prepared by immersing a graphitic material in an oxidizing agent to form an optically opaque suspension and allowing an oxidizing reaction to proceed until an optically transparent or translucent solution is formed, and wherein said graphitic material is selected from natural graphite, artificial graphite, meso-phase carbon, meso-phase pitch, meso-carbon microbead, soft carbon, hard carbon, coke, carbon fiber, carbon nano-fiber, carbon nano-tube, or a combination thereof.

35. The system of claim 1, wherein a thermal transfer material is positioned between the heat-conducting layer and the heat source.

36. The system of claim 35, wherein the thermal transfer material comprises a metal or a thermal interface material.

37. The system of claim 1, wherein the electronic device is a portable computing device containing a central processing unit (CPU) or a battery as a heat source.

\* \* \* \* \*